United States Patent
Kitaura et al.

(10) Patent No.: US 11,257,992 B2
(45) Date of Patent: Feb. 22, 2022

(54) METHOD FOR PRODUCING SEALED OPTICAL SEMICONDUCTOR DEVICE

(71) Applicants: Dow Corning Toray Co., Ltd., Tokyo (JP); Dow Silicones Corporation, Midland, MI (US)

(72) Inventors: Eiji Kitaura, Chiba (JP); Masaaki Amako, Chiba (JP); Steven Swier, Midland, MI (US)

(73) Assignees: DuPont Toray Specialty Materials Kabushiki Kaisha, Tokyo (JP); Dow Silicones Corporation, Midland, MI (US)

( * ) Notice: Subject to any disclaimer, the term of this patent is extended or adjusted under 35 U.S.C. 154(b) by 62 days.

(21) Appl. No.: 16/637,531

(22) PCT Filed: Aug. 31, 2018

(86) PCT No.: PCT/JP2018/032424
§ 371 (c)(1),
(2) Date: Feb. 7, 2020

(87) PCT Pub. No.: WO2019/049791
PCT Pub. Date: Mar. 14, 2019

(65) Prior Publication Data
US 2020/0220055 A1    Jul. 9, 2020

(30) Foreign Application Priority Data
Sep. 8, 2017 (JP) .............................. JP2017-172929

(51) Int. Cl.
*H01L 33/52* (2010.01)
*H01L 33/50* (2010.01)

(52) U.S. Cl.
CPC .............. *H01L 33/52* (2013.01); *H01L 33/50* (2013.01); *H01L 2933/005* (2013.01); *H01L 2933/0041* (2013.01)

(58) Field of Classification Search
CPC . H01L 33/52; H01L 33/50; H01L 2933/0041; H01L 2933/005
See application file for complete search history.

(56) References Cited

U.S. PATENT DOCUMENTS 8,547,011 B2   10/2013   Yamada et al.
8,597,988 B2   12/2013   Shaikevitch et al.
(Continued)

FOREIGN PATENT DOCUMENTS

CN   104170101     11/2014
CN   104170101 A   11/2014
(Continued)

OTHER PUBLICATIONS

English language abstract and machine-assisted English translation for WO 2015/068652 A1 extracted from espacenet.com database on May 10, 2021, 18 pages.
(Continued)

*Primary Examiner* — Eliseo Ramos Feliciano
*Assistant Examiner* — Mikka Liu
(74) *Attorney, Agent, or Firm* — Howard & Howard Attorneys PLLC (57) ABSTRACT

A method for producing a sealed optical semiconductor device includes: placing inner and outermost layer sealing films on a substrate on which an optical semiconductor element is mounted within a pressure reduction chamber, and reducing the pressure; a step in which the outermost film is heated, and at least the periphery of the outermost film is thermally fused to the surface of the substrate; and a step in which the reduction of pressure is released, and the substrate (Continued)

is sealed by the outermost film and the inner film. The temperature $T_2$ of the substrate when the reduction of pressure is released is a temperature at which the outermost film exhibits a tensile strength of 0.02-0.15 MPa and an elongation at break of 200-450%. The inner film exhibits a loss tangent (tan δ) of 1.6 or more at the temperature $T_2$.

18 Claims, 2 Drawing Sheets

(56) References Cited

U.S. PATENT DOCUMENTS

| | | | |
|---|---|---|---|
| 9,950,468 | B2 | 4/2018 | Shaikevitch et al. |
| 10,014,108 | B2 | 7/2018 | Petrzilek et al. |
| 2008/0018230 | A1 | 1/2008 | Yamada et al. |
| 2009/0020779 | A1 | 1/2009 | Yamada et al. |
| 2012/0126281 | A1 | 5/2012 | Shaikevitch et al. |
| 2013/0319607 | A1 | 12/2013 | Shaikevitch et al. |
| 2015/0041841 | A1 | 2/2015 | Basin et al. |
| 2015/0076458 | A1* | 3/2015 | Lee .............. H01L 51/56 257/40 |
| 2015/0321387 | A1 | 11/2015 | Bravet et al. |

FOREIGN PATENT DOCUMENTS

| | | |
|---|---|---|
| CN | 107995920 | 5/2018 |
| CN | 107995920 A | 5/2018 |
| EP | 1745922 A1 | 1/2007 |
| EP | 2837040 A1 | 2/2015 |
| JP | H 05-110256 | 4/1993 |
| JP | H05110256 A | 4/1993 |
| JP | H 06-190956 | 7/1994 |
| JP | H06190956 A | 7/1994 |
| JP | 2016-171314 | 9/2016 |
| JP | 2016-171325 | 9/2016 |
| JP | 2016171314 A | 9/2016 |
| JP | 2016171325 A | 9/2016 |
| JP | 2016-201546 | 12/2016 |
| JP | 2016201546 A | 12/2016 |
| KR | 2007-0024547 | 3/2007 |
| KR | 20070024547 A | 3/2007 |
| KR | 2015-0001766 | 1/2015 |
| KR | 20150001766 A | 1/2015 |
| KR | 2016-0150657 | 12/2016 |
| KR | 20160150657 A | 12/2016 |
| TW | 201728739 | 8/2017 |
| TW | 201728739 A | 8/2017 |
| WO | 2005105428 A1 | 11/2005 |
| WO | WO 2005/105428 | 11/2005 |
| WO | 2012023119 A1 | 2/2012 |
| WO | 2013154602 A1 | 10/2013 |
| WO | 2015068652 A1 | 5/2015 |
| WO | WO-2015068652 A1 * | 5/2015 ............. B32B 15/00 |
| WO | 2016065016 A1 | 4/2016 |
| WO | 2017057074 A1 | 4/2017 |
| WO | WO 2017/057074 | 4/2017 |

OTHER PUBLICATIONS

International Search Report for Application No. PCT/JP2018/032432 dated Oct. 9, 2018, 2 pages.
International Search Report for Application No. PCT/JP2018/032424 dated Oct. 9, 2018, 2 pages.
English language abstract for CN 104170101 extracted from espacenet.com database on Feb. 24, 2020, 2 pages.
English language abstract and machine-assisted English translation for CN 107995920 extracted from espacenet.com database on Feb. 24, 2020, 47 pages.
English language abstract and machine-assisted English translation for JPH 05-110256 extracted from espacenet.com database on Feb. 24, 2020, 4 pages.
English language abstract and machine-assisted English translation for JPH 06-190956 extracted from espacenet.com database on Feb. 24, 2020, 6 pages.
English language abstract and machine-assisted English translation for JP 2016-171314 extracted from espacenet.com database on Feb. 24, 2020, 34 pages.
English language abstract for JP 2016-171325 extracted from espacenet.com database on Feb. 24, 2020, 1 page.
English language abstract for JP 2016-201546 extracted from espacenet.com database on Feb. 24, 2020, 2 pages.
English language abstract for KR 2007-0024547 extracted from espacenet.com database on Feb. 24, 2020, 1 page.
English language abstract for KR 2015-0001766 extracted from espacenet.com database on Feb. 24, 2020, 2 pages.
English language abstract for KR 2016-0150657 extracted from espacenet.com database on Feb. 24, 2020, 2 pages.
English language abstract and machine-assisted English translation for TW 201728739 extracted from espacenet.com database on Feb. 24, 2020, 41 pages.
English language abstract for WO 2005/105428 extracted from espacenet.com database on Feb. 24, 2020, 1 page.
English language abstract and machine-assisted English translation for WO 2017/057074 extracted from espacenet.com database on Feb. 24, 2020, 41 pages.
U.S. Appl. No. 16/634,808, filed Jan. 28, 2020.

\* cited by examiner

METHOD FOR PRODUCING SEALED OPTICAL SEMICONDUCTOR DEVICE

CROSS-REFERENCE TO RELATED APPLICATIONS

The present application is the National Stage of International Patent Application No. PCT/JP2018/032424 filed on Aug. 31, 2018, which claims priority to and all the benefits of Japanese Application No. 2017-172929 filed on Sep. 8, 2017, which are both hereby expressly incorporated herein by reference in their entirety.

TECHNICAL FIELD

The present invention relates to a method for producing a sealed optical semiconductor device using a sealing film, and in particular to a method for producing a sealed optical semiconductor device using a sealing film that contains high levels of a phosphor and/or filler.

BACKGROUND ART

In optical semiconductor devices on which an optical semiconductor element, such as a photocoupler, light emitting diode, or solid-state imaging device is mounted, the optical semiconductor element is sealed using a sealant in order to improve the reliability of the optical semiconductor element. Known methods for sealing optical semiconductor devices include sealing methods using sealing films.

For example, Patent Document 1 discloses a method for producing an LED device by: mounting at least one LED element on a substrate; disposing, over the aforementioned LED element, a lamination layer of a predetermined shape, having a first and a second surface, the first surface including a binder supported on a base film and phosphor particles; heating the lamination layer to a first temperature, to soften the lamination layer and form a gastight seal between the lamination layer and the substrate surrounding the LED element; then, after removing the base film, heating the lamination layer to a second temperature under reduced pressure so as to remove air between the lamination layer and the substrate; and subsequently shaping the lamination layer that covers the LED element by pressing the lamination layer against the substrate by way of returning to atmospheric pressure.

Patent Document 2 discloses a vacuum lamination method including a single heating step of heating a central portion of a lamination layer having a predetermined shape so as to produce a flowable state, before an article such as a light-emitting diode array, which has been placed in an inner portion of a first surface of a substrate wafer, is conformally coated with the aforementioned lamination layer, and which includes a step of arranging a central portion of the lamination layer, which has been heated so as to produce a flowable state, so as to be spaced apart from the aforementioned inner portion of the first surface, by way of a gastight sealed inner region constituted by a gastight seal, which is formed by an edge portion of the aforementioned lamination layer and an outer portion of the first surface, and by the aforementioned lamination layer and the aforementioned first surface.

Patent Document 3 discloses a method for producing a sealed optical semiconductor element characterized by comprising: a sealing sheet preparation step of preparing a sealing sheet, which is a sealing sheet comprising a sealing layer, and is used to seal an optical semiconductor element, wherein a curve showing a relationship between a temperature T and a storage shear modulus G' obtained by measuring the dynamic viscoelasticity of the aforementioned sealing layer under conditions of a frequency of 1 Hz and a temperature rise rate of 10° C./min, has a minimum value, and the temperature T at the aforementioned minimum value is in the range of not less than 60° C. and not more than 200° C. and, furthermore, the storage shear modulus G' at the aforementioned minimum value is in the range of not less than 5 Pa and not more than 1,000 Pa; an element preparation step of preparing an optical semiconductor element disposed on a substrate; and a hot press step of hot pressing the aforementioned sealing sheet against the aforementioned optical semiconductor element at a temperature of not less than 60° C. and not more than 200° C.

Patent Document 4 discloses a method for producing an adhering optical semiconductor element characterized by comprising: an adherent sheet preparation step of preparing an adherent sheet, which is an adherent sheet comprising an adherent layer, and is used so as to be directly or indirectly adhered to an optical semiconductor element, wherein a curve showing a relationship between a temperature T and a storage shear modulus G' obtained by measuring the dynamic viscoelasticity of the aforementioned adherent layer under conditions of a frequency of 1 Hz and a temperature rise rate of 20° C./min, has a minimum value, and the temperature T at the aforementioned minimum value is in the range of not less than 40° C. and not more than 200° C. and, furthermore, the storage shear modulus G' at the aforementioned minimum value is in the range of not less than 1,000 Pa and not more than 90,000 Pa; an element preparation step of preparing an optical semiconductor element disposed on a substrate; and a hot press step of directly or indirectly hot pressing the aforementioned adherent sheet against the optical semiconductor element at a temperature of not less than 40° C. and not more than 200° C.

PRIOR ART DOCUMENTS

Patent Documents

PATENT DOCUMENT 1: WO 2012/023119
PATENT DOCUMENT 2: WO 2016/065016
PATENT DOCUMENT 3: JP 2016-171314 A
PATENT DOCUMENT 4: JP 2016-171315 A

SUMMARY OF THE INVENTION

Problems to be Solved by the Invention

However, a drawback of methods for sealing optical semiconductor elements using a sealing film is that, in conventional methods, the optical semiconductor element cannot be sealed in a highly reliable manner when the sealing film has the physical property of poor stretchability.

An object of the present invention is to provide a method for producing a sealed optical semiconductor device that makes it possible to seal an optical semiconductor element in a highly reliable manner even when the physical properties of a sealing film in an inner layer include poor stretchability.

Means for Solving the Problems

The present inventors undertook intensive study in order to solve the problems described above, and perfected the present invention upon finding that, when sealing an optical semiconductor element using a sealing film, even in cases where the sealing film contains a high level of particles such as phosphors and fillers and thus has the physical property of poor stretchability, it is possible to seal an optical semiconductor element mounted on a substrate, in a highly reliable manner, by combining such a sealing film with another sealing film and performing a lamination step under specific temperature conditions.

The method for producing a sealed optical semiconductor device according to the present invention comprises:

a step in which at least two types of sealing films including an inner layer sealing film and an outermost layer sealing film are placed in this order on an optical semiconductor element mounting substrate on which an optical semiconductor element is mounted within a pressure reduction chamber and the pressure in the pressure reduction chamber is reduced;

a step in which the outermost layer sealing film is heated and at least the periphery of the outermost layer sealing film is thermally fused to the surface of the optical semiconductor element mounting substrate; and a step in which the reduction of pressure within the pressure reduction chamber is released and the optical semiconductor element mounting substrate is sealed by the outermost layer sealing film and the inner layer sealing film, said method characterized in that the temperature $T_2$ of the optical semiconductor element mounting substrate when the reduction of pressure within the pressure reduction chamber is released is a temperature at which the outermost layer sealing film exhibits a tensile strength of 0.02-0.15 MPa and an elongation at break of 200-450%, and the inner layer sealing film exhibits a loss tangent (tan δ) of 1.6 or more at the temperature $T_2$.

In the method for producing a sealed optical semiconductor device of the present invention, the sealing film is preferably made of a thermosetting silicone resin.

In the method for producing a sealed optical semiconductor device of the present invention, particles are preferably selected from phosphors and fillers.

In the method for producing a sealed optical semiconductor device of the present invention, the sealing film preferably has a thickness of not less than 10 μm and not more than 300 μm.

In the method for producing a sealed optical semiconductor device of the present invention, the temperature $T_2$ is preferably not less than 70° C. and not more than 180° C.

In the method for producing a sealed optical semiconductor device of the present invention, the minimum distance between the optical semiconductor elements is preferably greater than the total thickness of the sealing films.

In the method for producing a sealed optical semiconductor device of the present invention, the aspect ratio (T/L) between the height T of the optical semiconductor element and the distance L between the optical semiconductor elements is preferably, at a maximum, not more than 3.

Effects of the Invention

The method for producing a sealed optical semiconductor device of the present invention is characterized by making it possible to produce a sealed optical semiconductor device in a highly reliable manner even when the physical properties of a sealing film in an inner layer include poor stretchability.

MODES FOR CARRYING OUT THE INVENTION

Hereafter, modes of embodiment of the present invention will be described in detail. The present invention is not limited to the following modes of embodiment, but rather may be carried out with various modifications without departing from the scope of the gist thereof.

Method for Producing Sealed Optical Semiconductor Device

The method for producing a sealed optical semiconductor device according to the present invention comprises:

(1) a step in which at least two types of sealing films including an inner layer sealing film and an outermost layer sealing film are placed in this order on an optical semiconductor element mounting substrate on which an optical semiconductor element is mounted within a pressure reduction chamber and the pressure in the pressure reduction chamber is reduced;

(2) a step in which the outermost layer sealing film is heated and at least the periphery of the outermost layer sealing film is thermally fused to the surface of the optical semiconductor element mounting substrate; and (3) a step in which the reduction of pressure within the pressure reduction chamber is released and the optical semiconductor element mounting substrate is sealed by the outermost layer sealing film and the inner layer sealing film, said method characterized in that the temperature $T_2$ of the optical semiconductor element mounting substrate when the reduction of pressure within the pressure reduction chamber is released is a temperature at which the outermost layer sealing film exhibits a tensile strength of 0.02-0.15 MPa and an elongation at break of 200-450%, and the inner layer sealing film exhibits a loss tangent (tan δ) of 1.6 or more at the temperature $T_2$.

According to the present invention configured in this manner, the outermost layer sealing film placed on the outside of the inner layer sealing film exhibits mechanical properties that allow it to cover the optical semiconductor element in a manner conforming to the shape of the optical semiconductor element (hereinafter, also referred to as "conformal lamination") at the temperature $T_2$ of the optical semiconductor element mounting substrate when the reduced pressure within the pressure reduction chamber is released, and can thus seal the optical semiconductor device to be sealed in a highly reliable manner along with the inner layer sealing film. The step of forming a gastight space between the outermost layer sealing film and the surface of the region to be sealed on the optical semiconductor element mounting substrate by the step of heating the outermost layer sealing film under reduced pressure to thermally fuse the peripheral portion of the outermost sealing film to the surface of the optical semiconductor element mounting substrate, and the step of sealing the optical semiconductor element mounting substrate with the outermost sealing film by releasing the reduced pressure can be performed in consecutive operations, allowing the sealed optical semiconductor device to be produced easily. Hereafter, each of the steps will be described in detail.

(1) The step in which at least two types of sealing films including an inner layer sealing film and an outermost layer sealing film are placed in this order on an optical semiconductor element mounting substrate on which an optical semiconductor element is mounted within a pressure reduction chamber and the pressure in the pressure reduction chamber is reduced is a step in which the at least two types of sealing films are laminated on the optical semiconductor element mounting substrate on which an optical semiconductor element to be sealed is mounted, in the pressure reduction chamber, and the pressure in the pressure reduction chamber is then reduced. The at least two types of sealing films are at least one type of inner layer sealing film and outermost layer sealing film, and are laminated in the order of inner layer sealing film and outermost layer sealing film, beginning from the optical semiconductor element mounting substrate. The sealing films configured in this manner are placed on the optical semiconductor element mounting substrate at a position suitable for sealing the optical semiconductor element to be sealed.

The pressure reduction chamber is internally provided with a heating means for heating the optical semiconductor element mounting substrate and the sealing film. Preferably, the pressure reduction chamber is internally provided with a heating plate for heating the optical semiconductor element mounting substrate and the sealing films, which serves as the heating means. An example of such a pressure reduction chamber is a vacuum lamination device. In order to stabilize the process, the pressure reduction chamber is preferably provided with a mechanism for preventing the optical semiconductor element mounting substrate from contacting the heating means until the reduction of the internal pressure is completed, in order to prevent the peripheral portion of the outermost layer sealing film from being thermally fused to the optical semiconductor element mounting substrate before reduction of the internal pressure is completed. There are no particular limitations on such pressure reduction chambers, and these include, for example, vacuum laminators having a lift-pin elevation mechanism. Furthermore, by using a special lamination jig, a diaphragm-type vacuum laminator can be used. For example, the lamination jig has a structure in which an elastic body such as a spring supports the optical semiconductor element mounting substrate, and is designed so that, when a rubber diaphragm membrane is in the regular position, the optical semiconductor element mounting substrate can be spaced apart from the heating means, but when pressure is applied to the rubber diaphragm membrane, the elastic body provided in the lamination jig is pressed, whereby the optical semiconductor element mounting substrate can be brought into contact with the heating means. The lamination jig has a structure that protects the optical semiconductor element mounting substrate and the outermost layer sealing film so that the rubber diaphragm membrane does not directly contact the optical semiconductor element mounting substrate or the outermost layer sealing film, even when the rubber diaphragm membrane presses the lamination jig.

There are no particular limitations on the optical semiconductor element, but examples thereof include a light emitting diode (LED), a semiconductor laser, a photodiode, a phototransistor, a solid-state image pickup, a light emitter and a light receiver for a photocoupler; a light emitting diode (LED) is particularly preferred.

An optical semiconductor element mounting substrate is a substrate on which an optical semiconductor element has been mounted or installed. Materials having high light transmittance or high reflectance are preferred as such substrates. Examples of optical semiconductor element mounting substrates include: conductive metals such as silver, gold, and copper; non-conductive metals such as aluminum and nickel; thermoplastic resins in which white pigment, such as PPA and LCP is mixed; thermosetting resins containing white pigment such as epoxy resins, BT resins, polyimide resins, and silicone resins; ceramics such as alumina and alumina nitride; and the like.

The sealing films are for sealing the optical semiconductor element that is to be sealed, and are formed by processing a sealant into a film form. In the present invention, at least two types of sealing films including an inner layer sealing film and outermost layer sealing film are used as the sealing films. In addition to the inner layer sealing film and the outermost layer sealing film, another sealing film may be included as a sealing film.

The sealant constituting the sealing film can be made of a thermoplastic material or a thermosetting material. Such materials can be organic polymers or silicones. In terms of organic polymers, thermoplastic resins or thermosetting resins such as polyolefin resins, ethyl vinyl acetate (EVA) resins, epoxy resins, polyacrylate resins, or poly (vinyl butyral) resins can be mentioned. In terms of silicones, thermoplastic silicones or thermosetting silicones, such as hot-melt silicones or linear silicones (or "straight-chain silicones") can be mentioned. Furthermore, the silicone can also be cured by a condensation reaction, hydrosilylation reaction, or free radical reaction. According to a certain mode of embodiment, the sealing film can be made of a thermoplastic resin. According to another mode of embodiment, the sealing film can be made of a thermosetting resin. According to yet another mode of embodiment, the sealing film can be made of a hydrosilylation reaction-curable silicone. For example, a sealing film disclosed in WO 2016/065016 can be used as the sealing film. Such sealing films are available under the trade names LF-1200 and LF-1201, made by Dow Corning Toray Co. Ltd.

The inner layer sealing film may contain particles, the content of which is preferably not less than 80 mass % in the sealing film. The inner layer sealing film normally contains not more than 95 mass % of particles. Meanwhile, the outermost layer sealing film may contain particles or not contain particles in the sealing film. The outermost layer sealing film is also preferably transparent to control the color of the sealed optical semiconductor device. For example, the light transmittance of a 1 mm thick outermost layer sealing film at a wavelength of 450 nm is preferably not less than 90%. When the outermost layer sealing film contains particles, the content is, for example, not less than 40 mass %, preferably not less than 50 mass %, and more preferably not less than 60 mass %, and is normally less than 80 mass % in the sealing film.

Examples of particles included in the sealing film include phosphors and fillers. Examples of the phosphor include, but are not limited to, yellow, red, green, and blue light-emitting phosphors which are widely used in light emitting diodes (LED) and comprise an oxide-based phosphor, an oxynitride-based phosphor, a nitride-based phosphor, a sulfide-based phosphor, an oxysulfide-based phosphor, or the like. Examples of oxide-based phosphors include yttrium, aluminum and garnet-based YAG-based green to yellow emission phosphors containing cerium ions, terbium, aluminum and garnet-based TAG-based yellow emission phosphors containing cerium ions, and silicate-based green to yellow emission phosphors containing cerium and europium ions. Examples of oxynitride-based phosphors include silicon, aluminum, oxygen, and nitrogen-based SiAlON-based red to green emission phosphors, containing europium ions. Examples of nitride-based phosphors include calcium, strontium, aluminum, silicon, and nitrogen-based CASN-based red emission phosphors, containing europium ions. Examples of sulfide-based phosphors include ZnS-based green emission phosphors, containing copper ions and aluminum ions. Examples of oxysulfide-based phosphors include $Y_2O_2S$ type red emission phosphors, containing europium ions. One or a mixture of two or more of these phosphors may be used.

There are no limitations on the average particle size of the phosphor, but this is normally in the range of not less than 1 μm, and preferably not less than 5 μm, to not more than 50 μm, and preferably not more than 20 μm. The average particle size can be measured, for example, by measuring the cumulative volume-average particle size ($D_{50}$) by a laser diffraction scattering particle size distribution measurement method.

Examples of fillers include reinforcing fillers such as precipitated silica, wet silica, or fumed silica; fillers obtained by hydrophobizing these fillers with organosilicon compounds such as organohalosilane, organoalkoxysilane, or hexaorganodisilazane; inorganic extender fillers such as alumina, calcined silica, titanium oxide, glass, quartz, aluminosilicate, iron oxide, zinc oxide, calcium carbonate, silicon carbide, silicon nitride, and boron nitride; and fine powders of organic resins such as silicone resins, epoxy resins, and fluororesins.

There are no limitations on the average particle size of the filler, but this is normally in the range of not less than 1 μm, and preferably not less than 5 μm, to not more than 50 μm, and preferably not more than 20 μm. The average particle size can be measured, for example, by measuring the cumulative volume-average particle size ($D_{50}$) by a laser diffraction scattering particle size distribution measurement method.

Dyes, pigments, flame retardants, heat resistance agents, and the like can be blended as other optional components in the sealing film.

There are no particular limitations on the thickness of the sealing film but this is, for example, not less than 10 μm, and preferably not less 20 μm, to not more than 300 μm, and preferably not more than 200 μm.

The outermost layer sealing film and inner layer sealing film can be designed, as appropriate, to a size allowing the optical semiconductor mounting substrate to be covered. The size of the outermost layer sealing film is normally greater than that of the inner layer sealing film so as to be able to cover the optical semiconductor element mounting substrate along with the inner layer sealing film.

One optical semiconductor element may be installed, or a plurality of two or more may be installed, on the optical semiconductor element mounting substrate. Preferably, a plurality of optical semiconductor elements are mounted on optical semiconductor element mounting substrate. When a plurality of optical semiconductor elements are mounted on the optical semiconductor element mounting substrate, the minimum distance between the optical semiconductor elements is preferably greater than the thickness of the outermost layer sealing film in order to ensure coverage by the sealing films in a manner that conforms to the shape of the optical semiconductor elements, which is to say, the formation of conformal lamination. The minimum distance between the optical semiconductor elements is therefore usually not less than 20 μm. There are no particular limitations on the maximum distance between the optical semiconductor elements, but this is usually less than twice the thickness of the outermost layer sealing film of the sealing films. The maximum distance between the optical semiconductor elements is therefore usually not more than 0.6 mm, and preferably not less than 0.4 mm. In order to ensure the formation of conformal lamination, this is usually designed so that the aspect ratio (T/L) of the distance from the top surface of the optical semiconductor element to the surface of the optical semiconductor element mounting substrate, which is to say, the height T of the optical semiconductor element, to the distance L between the optical semiconductor elements, is, at a maximum, not more than 3, more preferably, at a maximum, not more than 2.5, and still more preferably, at a maximum, not more than 2.

The pressure in the pressure reduction chamber can be reduced by a conventionally known pressure reduction means; for example, this can be performed by operating a vacuum pump connected to the interior of the pressure reduction chamber. Usually, the pressure in the pressure reduction chamber is reduced to not more than 300 Pa, and preferably not more than 200 Pa, or not more than 133 Pa.

(2) The step of heating the outermost layer sealing film so as to thermally fuse at least the peripheral portion of the outermost layer sealing film to the surface of the optical semiconductor element mounting substrate is a step of heating the outermost layer sealing film to a temperature of not less than $T_1$, so as to soften the outermost layer sealing film, allowing it to bend, so as to bring the outermost layer sealing film and the optical semiconductor element mounting substrate into contact with each other, and thermally fuse at least the peripheral portion of the outermost layer sealing film to the peripheral portion of the region of the optical semiconductor element to be sealed, and thus form a gastight space between the outermost layer sealing film and the surface of the optical semiconductor element mounting substrate in the region to be sealed. By way of this step, the outermost layer sealing film is given suitable flexibility for conformal lamination, and the space between the outermost layer sealing film and the surface of the optical semiconductor element mounting substrate in the region to be sealed can be closed (also referred to as "sealed") to produce a gastight state. The inner layer sealing film can also be given suitable flexibility for conformal lamination.

The outermost layer sealing film and inner layer sealing film are heated by a heating means provided in the pressure reduction chamber. For example, a heating plate provided in the pressure reduction chamber can be used as the heating means. Normally, the outermost layer sealing film and inner layer sealing film are heated by heating the optical semiconductor element mounting substrate. For example, if a heating plate is used as the heating means, heat is transferred from the optical semiconductor element mounting substrate to the outermost layer sealing film and inner layer sealing film, by way of bringing the optical semiconductor element mounting substrate and the heating plate into contact with each other, and thus heating the outermost layer sealing film and inner layer sealing film.

In this step, the outermost layer sealing film and inner layer sealing film are held at a temperature which is not less than the temperature $T_1$ and not more than the temperature $T_2$. There are no particular limitations on the temperature $T_1$, as long as it is not so high as to cause thermal fusion of the film while reducing the pressure in the chamber such that the region to be sealed cannot be gastightly sealed (air remains trapped); the temperature is 60° C. at the highest. Furthermore, the sealing film is normally held at a temperature of $T_1$ to $T_2$ for not less than 1 minute and not more than 10 minutes. This is because, if held for more than 10 minutes, curing of the sealing film advances, which tends to cause poor lamination.

The step of heating the outermost layer sealing film so as to thermally fuse at least the peripheral portion of the outermost layer sealing film to the optical semiconductor element mounting substrate may be performed after step (1) is completed, or may be performed during step (1) before step (1) is completed. That is to say, heating of the outermost layer sealing film to not less than the temperature $T_1$ may be started before the pressure in the pressure reduction chamber is reduced to the predetermined range. From the viewpoint of the stability of the process, step (2) is preferably performed after reduction of the pressure within the pressure reduction chamber in step (1) is completed.

(3) The step of releasing the reduced pressure within the pressure reduction chamber so as to seal the optical semiconductor element mounting substrate with the outermost layer sealing film and inner layer sealing film is a step of releasing the reduced pressure within the pressure reduction chamber so as to press bond the outermost layer sealing film against the optical semiconductor element mounting substrate by way of the pressure difference between the outside air and the gastight space between the outermost layer sealing film and the surface of the region of the optical semiconductor element mounting substrate to be sealed, and thus laminate the optical semiconductor element mounting substrate. In this step, the outermost layer sealing film is press bonded against the optical semiconductor element mounting substrate, so that the inner layer sealing film disposed between the optical semiconductor element mounting substrate and outermost layer sealing film is also press bonded against the optical semiconductor element mounting substrate, forming a covering.

The expression "releasing the reduced pressure within the pressure reduction chamber" normally means opening the pressure reduction chamber to the atmosphere so as to return the reduced pressure in the pressure reduction chamber to atmospheric pressure. It is not necessary for the pressure to be returned to atmospheric pressure immediately, but rather the reduced pressure may be gradually released, in a range that allows conformal lamination of the optical semiconductor element mounting substrate to be achieved by the pressure bonding of the sealing films against the optical semiconductor element mounting substrate. The reduced pressure in the pressure reduction chamber is normally returned to atmospheric pressure at a rate of 10 kPa/sec, and preferably 50 kPa/sec, or 100 kPa/sec. This is because, if the rate of change from reduced pressure to atmospheric pressure is too slow, the seal may leak and lamination may be incomplete.

The temperature $T_2$ of the optical semiconductor element mounting substrate when the reduced pressure within the pressure reduction chamber is released is set to a temperature at which the outermost layer sealing film has physical characteristics that are suitable for allowing the formation of conformal lamination on the optical semiconductor element. Specifically, the temperature is a temperature at which the outermost layer sealing film exhibits a tensile strength of 0.02-0.15 MPa and an elongation at break of 200-450%. $T_2$ is preferably a temperature at which the outermost layer sealing film exhibits a tensile strength of not less than 0.03 MPa. $T_2$ is also preferably a temperature at which the outermost layer sealing film exhibits an elongation at break of not less than 250%. Preferably, $T_2$ is a temperature at which the outermost layer sealing film exhibits an elongation at break of not more than 400%. The tensile strength and elongation at break of the outermost layer sealing film can be measured in advance by ordinary methods in the present technical field, before implementing the present invention. For example, measurement can be performed using an RSA-G2 dynamic viscoelasticity measurement instrument made by TA Instruments. Because the outermost layer sealing film exhibits the aforementioned physical characteristics at the temperature $T_2$, the optical semiconductor element mounted on the substrate can be sealed in a highly reliable manner.

The inner layer sealing film exhibits a loss tangent (tan δ) of 1.6 or more at the temperature $T_2$. The inner layer sealing film preferably exhibits a loss tangent (tan δ) of 1.7 or more at the temperature $T_2$. The loss tangent (tan δ) of the inner layer sealing film can be determined in advance using a viscoelasticity measuring instrument (such as the ARES Rheometer by Rheometric Scientific). The inner layer sealing film exhibits a loss tangent (tan δ) of 1.6 or more at the temperature $T_2$, and is thereby adequately laminated without producing voids or cracks.

There are no particular limitations on the temperature $T_2$ of the optical semiconductor element mounting substrate when the reduced pressure within the pressure reduction chamber is released, as long as the aforementioned conditions are satisfied, but this is, for example, not less than 70° C., and preferably not less than 90° C., to not more than 180° C., and preferably not more than 150° C.

Hereafter, specific modes of embodiment of the present invention will be described in more detail with reference to the drawings.

Figure 1:
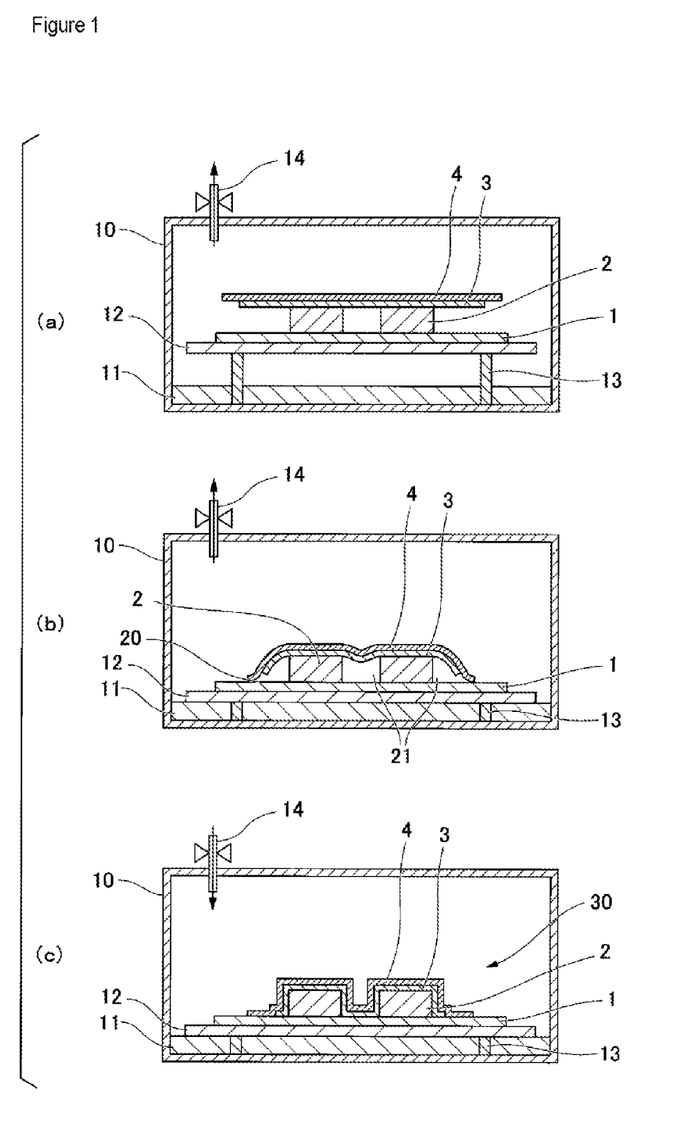
FIG. 1 is a schematic cross-sectional view illustrating one example of a method according to the present invention implemented using a vacuum laminator having a lift-pin elevation mechanism.

FIG. 1 is a schematic sectional view showing one example of the production method according to the present invention, which is carried out using a vacuum laminator 10 having a lift-pin elevation mechanism, as the pressure reduction chamber.

FIG. 1 (*a*) illustrates step (1) of the present invention in the present mode of embodiment. In this step (1), the inner layer sealing film 3 and outermost layer sealing film 4 are placed in this order on an optical semiconductor element mounting substrate 1 on which an optical semiconductor element 2 is mounted. Furthermore, the optical semiconductor element mounting substrate 1 is disposed on a middle plate 12 which can be raised and lowered by lift-pins 13. The interior of the vacuum laminator 10 is connected to a pressure reduction means (not shown) via an opening 14, and the pressure within the vacuum laminator 10 is reduced by operating the pressure reduction means. Here, at the start of step (1), the middle plate 12 is disposed spaced apart from the heating plate 11 by the lift-pins 13, so as to prevent the inner layer sealing film 3 and outermost layer sealing film 4 from being heated by the heating plate 11 to not less than the temperature $T_1$ before pressure reduction within the vacuum laminator 10 has sufficiently advanced. The stability of the process can thereby be ensured.

FIG. 1 (*b*) illustrates step (2) of the present invention in the present mode of embodiment. In this step (2), the lift-pins 13 are lowered and the middle plate 12 is moved so as to come into contact with the heating plate 11. As a result, heat from the heating plate 11 is transmitted to the inner layer sealing film 3 and outermost layer sealing film 4 via the optical semiconductor element mounting substrate 1, and the inner layer sealing film 3 and outermost layer sealing film 4 are heated to a temperature higher than $T_1$. When the outermost layer sealing film 4 is heated, the outermost layer sealing film 4 softens and is deformed, such that at least a peripheral portion 20 of the outermost layer sealing film 4 comes into contact with the surface of the optical semiconductor element mounting substrate 1, and the peripheral portion 20 is thermally fused to the surface of the semiconductor element mounting substrate 1. At this time, a gastight space 21 is formed between the outermost layer sealing film 4 or inner layer sealing film 3 and the surface of the region of the optical semiconductor element mounting substrate 1 to be sealed.

FIG. 1 (c) illustrates step (3) of the present invention in the present mode of embodiment. In this step (3), when the temperature of the optical semiconductor element mounting substrate 1 reaches $T_2$, the reduced pressure within the vacuum laminator 10 is released via the opening 14, whereby the outermost layer sealing film 4 and inner layer sealing film 3 are press bonded against the optical semiconductor element mounting substrate 1 due to the pressure difference between the outside air and the gastight space 21 (not shown in FIG. 1 (c)), such that the optical semiconductor element 2 is sealed. As a result, a sealed optical semiconductor device 30 is obtained. In step (3), when the temperature of the optical semiconductor element mounting substrate 1 reaches the temperature $T_2$, which is a temperature at which the outermost layer sealing film exhibits physical characteristics suitable for allowing the formation of conformal lamination on the optical semiconductor element, the reduced pressure within the vacuum laminator 10 is released, whereby the covering by the inner layer sealing film 3 and outermost layer sealing film 4, which conforms to the shape of the optical semiconductor element 2, can be formed in a highly reliable manner.

Figure 2:
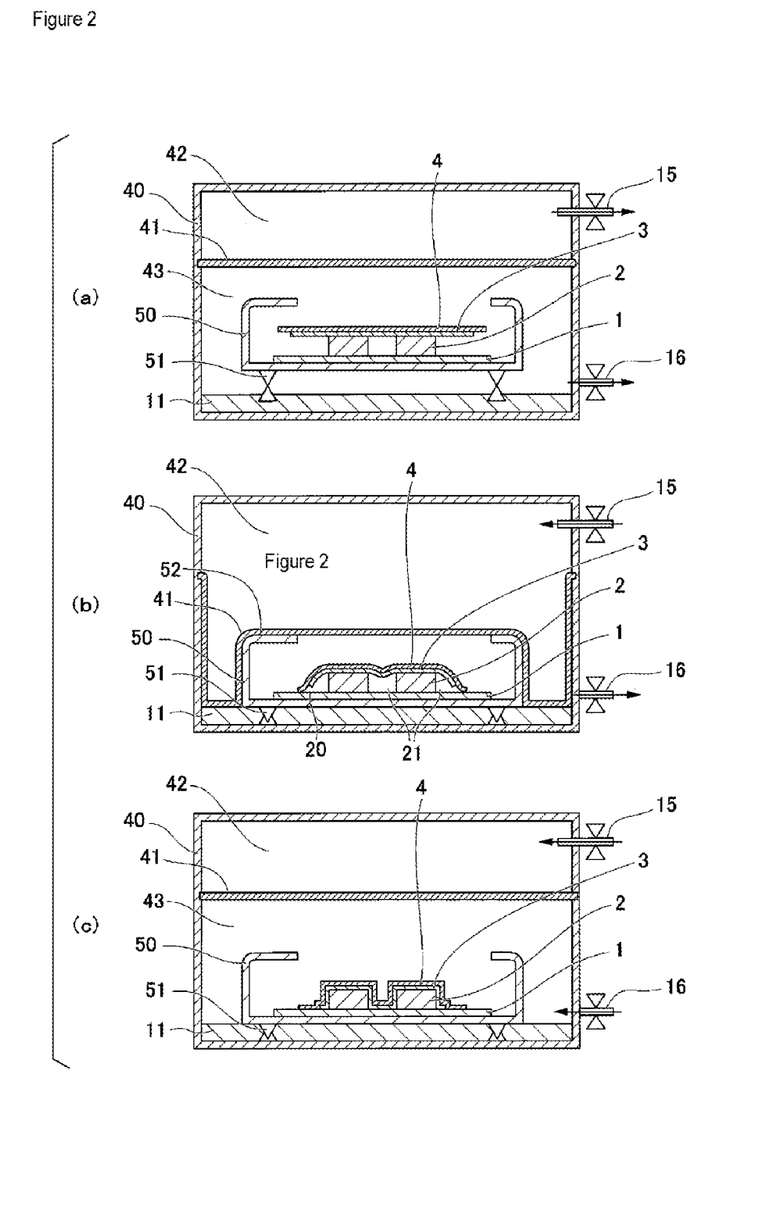
FIG. 2 is a schematic cross-sectional view illustrating one example of a method according to the present invention implemented using a diaphragm-type vacuum laminator and a lamination jig.

FIG. 2 is a schematic cross-sectional view illustrating one example of the production method according to the present invention, which is implemented using a diaphragm-type vacuum laminator 40 as a pressure reduction chamber, and a lamination jig 50.

FIG. 2 (a) illustrates step (1) of the present invention in the present mode of embodiment. The interior of the diaphragm-type vacuum laminator 40 is divided into an upper chamber 42 and a lower chamber 43, with a rubber diaphragm membrane 41 therebetween, and the interior of the upper chamber 42 and the lower chamber 43 are connected to a pressure reduction means (not illustrated for either) via openings 15 and 16, respectively, and the pressures within the upper chamber 42 and the lower chamber 43 are reduced by the operation of the pressure reduction means. The opening 15 of the upper chamber 42 may also be connected to a pressurizing means. In the figure, the inner layer sealing film 3 and outermost layer sealing film 4 are placed in this order on an optical semiconductor element mounting substrate 1 on which an optical semiconductor element 2 is mounted in the lower chamber 43. Further, the optical semiconductor element mounting substrate 1 is disposed within a specialized lamination jig 50. This lamination jig 50 is provided with springs 51, and the lamination jig 50 is disposed spaced apart from the heating plate 11 by way of the springs 51, such that the inner layer sealing film 3 and outermost layer sealing film 4 can be prevented from being heated to not less than the temperature $T_1$ by the heating plate 11, before pressure reduction of the lower chamber 43 has sufficiently advanced. The stability of the process can thereby be ensured.

FIG. 2 (b) illustrates step (2) of the present invention in the present mode of embodiment. In this step (2), the reduced pressure of the upper chamber 42 is released via the opening 15. As a result, the rubber diaphragm membrane 41 deforms so as to exert pressure on the lower chamber 43 due to the difference in reduced pressure between the upper chamber 42 and the lower chamber 43 (not shown in FIG. 2 (b)), and thus exert pressure on the spring 51, such that the lamination jig 50 comes into contact with the heating plate 11. As a result, heat from the heating plate 11 is transmitted to the inner layer sealing film 3 and outermost layer sealing film 4 via the optical semiconductor element mounting substrate 1, and the inner layer sealing film 3 and outermost layer sealing film 4 are heated to a temperature not less than $T_1$. When the outermost layer sealing film 4 is heated to not less than the temperature $T_1$, the outermost layer sealing film 4 softens, and the peripheral portion 20 of the outermost layer sealing film 4 comes into contact with the surface of the optical semiconductor element mounting substrate 1. As a result, the peripheral portion 20 is thermally fused to the surface of the semiconductor element mounting substrate 1, and a gastight space 21 is formed between the outermost layer sealing film 4 or inner layer sealing film 3 and the surface of the region of the optical semiconductor element mounting substrate 1 to be sealed. In this mode of embodiment, due to the structure of the upper frame 52 of the lamination jig 50, even when the rubber diaphragm membrane 41 exerts pressure on the lower chamber 43, the outermost layer sealing film 4 can be prevented from being pressed against the semiconductor element mounting substrate 1 by the rubber diaphragm membrane 41, and as a result, formation of the gastight space 21 can be ensured.

FIG. 2 (c) illustrates step (3) of the present invention in the present mode of embodiment. In this step (3), when the temperature of the optical semiconductor element mounting substrate 1 reaches $T_2$, the reduced pressure within the lower chamber 43 is released via the opening 16, whereby the outermost layer sealing film 4 and inner layer sealing film 3 are press bonded against the optical semiconductor element mounting substrate 2 due to the pressure difference between the outside air and the gastight space 21 (not shown in FIG. 2 (c)), such that the optical semiconductor element 2 is sealed. As a result, a sealed optical semiconductor device 30 is obtained. In step (3), when the temperature of the optical semiconductor element mounting substrate 1 reaches the temperature $T_2$, which is a temperature at which the outermost layer sealing film exhibits physical characteristics suitable for allowing the formation of conformal lamination on the optical semiconductor element, the reduced pressure within the lower chamber 43 is released, whereby the covering by the inner layer sealing film 3 and outermost layer sealing film 4, which conforms to the shape of the optical semiconductor element 2, can be formed in a highly reliable manner.

EXAMPLES

The method for producing a sealed optical semiconductor device of the present invention will be described in detail with reference to examples and comparative examples. However, the present invention is not limited to the description of the following examples.

Sealing Film

YAG-based yellow-emitting phosphor particles (made by Intematix Corporation, trade name NYAG 4454-S, average particle size 8 μm) were mixed in the amount of 85 mass % with respect to a thermosetting silicone composition (LF-1200 made by Dow Corning Toray Co. Ltd.) to prepare a sealing film D (containing 85 wt % phosphor particles) having a thickness of 100 μm.

YAG-based yellow-emitting phosphor particles (made by Intematix Corporation, trade name NYAG 4454-S, average particle size 8 μm) were mixed in the amount of 85 mass % with respect to a thermosetting silicone composition (LF-1201 made by Dow Corning Toray Co. Ltd.) to prepare a sealing film C (containing 85 wt % phosphor particles) having a thickness of 100 μm.

A transparent outermost layer sealing film A having a thickness of 100 μm was prepared using a thermosetting silicone composition (LF-1200 made by Dow Corning Toray Co. Ltd.). The light transmittance of this 1 mm thick outermost layer sealing film A at a wavelength of 450 nm was 100%.

A transparent outermost layer sealing film B having a thickness of 100 μm was prepared using a thermosetting silicone composition (LF-1201 made by Dow Corning Toray Co. Ltd.). The light transmittance of this 1 mm thick outermost layer sealing film B at a wavelength of 450 nm was also 100%.

The tensile strength and elongation at break of the outermost layer sealing films at 60° C., 80° C., 100° C., 120° C., and/or 140° C. were determined using an RSA-G2 dynamic viscoelasticity measuring instrument made by TA Instruments. Measurement samples, having a size 10 mm in length and 25 mm in width, were prepared and measured at a tensioning speed of 10 mm/min. The results are shown in Table 1 below.

The loss tangent of the inner layer sealing film was determined using the RSA-G2 dynamic viscoelasticity measuring instrument made by TA Instruments. Measurements were taken at a heating rate of 25° C./min from 25° C. to 200° C. using 8 mm parallel plates, a gap of 0.5-1.5 mm, a strain of 0.2%, and a frequency of 1.0 Hz to find the loss tangent (tan δ) at the target temperatures, 100° C., 110° C., 120° C., 130° C., and/or 140° C.

Optical Semiconductor Element Mounting Substrate

An optical semiconductor element mounting substrate, comprising a glass substrate on which cuboid optical semiconductor elements having a depth of 1 mm, a width of 1 mm, and a height of 0.15 mm were arranged, with 10 elements in the lengthwise direction and 10 elements in the crosswise direction, was used as the optical semiconductor element mounting substrate. The distance L between the optical semiconductor elements was uniformly 0.15 mm, and the aspect ratio (T/L) between the height T of the optical semiconductor element and the distance L between the optical semiconductor elements was 1.

Examples 1 to 2 and Comparative Examples 1 to 8

Vacuum lamination was performed on the semiconductor element mounting substrate using the inner layer sealing films A and B as well as the outermost layer sealing film obtained above. A vacuum laminator having a lift-pin elevation mechanism (made by Nisshinbo Mechatronics Corporation, trade name PVL-050 With Lift-Pin Mechanism), which was connected to a vacuum pump, was used as the pressure reduction chamber. First, optical semiconductor element mounting substrates were set on the middle plate, which could be elevated by the lift-pin elevation mechanism, and which was disposed at a position distant from the heating plate in the vacuum laminator, and the inner layer sealing film A or B was placed thereon. Then, the vacuum pump was driven to reduce the pressure within the vacuum laminator to 133 Pa. Next, the middle plate was lowered into contact with a heating plate that had been heated from 100° C. to 180° C. Thereafter, the sealing films were heated for 3 to 7 minutes and, when the temperature of the optical semiconductor element mounting substrate reached the predetermined temperature $T_2$, the reduced pressure was returned to atmospheric pressure over 10 seconds, to obtain a sealed optical semiconductor device.

The resulting sealed semiconductor device was visually observed to check for the presence of voids and/or cracks. The results are shown in Table 1 below.

TABLE 1

| | Outermost layer sealing film | Inner layer sealing film | Temperature $T_2$ (° C.) | Tensile strength of outermost layer sealing film at temperature $T_2$ (MPa) | Elongation at break of outermost layer sealing film at temperature $T_2$ (%) | Loss tangent of inner layer sealing film at temperature $T_2$ | Presence of voids/cracks |
|---|---|---|---|---|---|---|---|
| Example 1 | A | C | 120 | 0.04 | 350 | 1.81 | no |
| Example 2 | A | C | 130 | 0.03 | 390 | 2.01 | no |
| Comparative Example 1 | A | C | 60 | 0.10 | 220 | 1.51 | yes |
| Comparative Example 2 | A | C | 60 | 0.01 | 480 | 2.01 | yes |
| Comparative Example 3 | A | D | 80 | 0.04 | 350 | 1.55 | yes |
| Comparative Example 4 | A | D | 140 | 0.03 | 390 | 1.52 | yes |
| Comparative Example 5 | B | C | 100 | 0.10 | 220 | 1.47 | yes |
| Comparative Example 6 | B | C | 110 | 0.04 | 380 | 1.51 | yes |
| Comparative Example 7 | B | D | 100 | 0.10 | 220 | 1.10 | yes |
| Comparative Example 8 | B | D | 110 | 0.04 | 380 | 1.38 | yes |

Based on Table 1, it was confirmed that voids and/or cracks did not occur in the sealed optical semiconductor devices produced by the production methods in Examples 1 to 2, and that the sealing films formed a covering that conformed to the shape of the optical semiconductor elements.

INDUSTRIAL APPLICABILITY

The method for producing a sealed optical semiconductor device of the present invention is useful as a method for sealing an optical semiconductor element such as a light emitting diode (LED), a semiconductor laser, a photodiode, a phototransistor, a solid-state imaging device, or a light emitter or and a light receiver for a photocoupler.

EXPLANATION OF THE REFERENCE NUMERALS 1 optical semiconductor element mounting substrate
2 optical semiconductor element
3 inner layer sealing film
4 outermost layer sealing film
10 vacuum laminator
11 heating plate
12 middle plate
13 lift-pin
14 to 16 opening
20 peripheral portion of the sealing film
21 gastight space
30 sealed optical semiconductor device
40 diaphragm-type vacuum laminator
41 rubber diaphragm membrane
42 upper chamber
43 lower chamber
50 lamination jig
51 spring
52 upper frame

The invention claimed is:

1. A method for producing a sealed optical semiconductor device, comprising:
   a step in which at least two types of sealing films including an inner layer sealing film and an outermost layer sealing film are placed in this order on an optical semiconductor element mounting substrate on which an optical semiconductor element is mounted within a pressure reduction chamber and the pressure in the pressure reduction chamber is reduced;
   a step in which the outermost layer sealing film is heated and at least the periphery of the outermost layer sealing film is thermally fused to the surface of the optical semiconductor element mounting substrate; and
   a step in which the reduction of pressure within the pressure reduction chamber is released and the optical semiconductor element mounting substrate is sealed by the outermost layer sealing film and the inner layer sealing film, wherein the temperature $T_2$ of the optical semiconductor element mounting substrate when the reduction of pressure within the pressure reduction chamber is released is a temperature at which the outermost layer sealing film exhibits a tensile strength of 0.02-0.15 MPa and an elongation at break of 200-450%, and the inner layer sealing film exhibits a loss tangent (tan δ) of 1.6 or more at the temperature $T_2$.

2. The method for producing a sealed optical semiconductor device as claimed in claim 1, wherein the inner layer sealing film and the outermost sealing film are made of a thermosetting silicone resin.

3. The method for producing a sealed optical semiconductor device as claimed in claim 2, wherein at least one of the inner layer sealing film and the outermost layer sealing film comprises particles, and the particles are selected from phosphors and fillers.

4. The method for producing a sealed optical semiconductor device as claimed in claim 2, wherein each of the inner layer sealing film and the outermost sealing film has a thickness of not less than 10 μm and not more than 300 μm.

5. The method for producing a sealed optical semiconductor device as claimed in claim 2, wherein the temperature $T_2$ is not less than 70° C. and not more than 180° C.

6. The method for producing a sealed optical semiconductor device as claimed in claim 2, wherein a plurality of optical semiconductor elements are mounted on the optical semiconductor element mounting substrate, and a minimum distance between the optical semiconductor elements on the optical semiconductor element mounting substrate is greater than the total thickness of the sealing films.

7. The method for producing a sealed optical semiconductor device as claimed in claim 3, wherein each of the inner layer sealing film and the outermost sealing film has a thickness of not less than 10 μm and not more than 300 μm.

8. The method for producing a sealed optical semiconductor device as claimed in claim 3, wherein the temperature $T_2$ is not less than 70° C. and not more than 180° C.

9. The method for producing a sealed optical semiconductor device as claimed in claim 1, wherein at least one of the inner layer sealing film and the outermost layer sealing film comprises particles, and the particles are selected from phosphors and fillers.

10. The method for producing a sealed optical semiconductor device as claimed in claim 9, wherein each of the inner layer sealing film and the outermost sealing film has a thickness of not less than 10 μm and not more than 300 μm.

11. The method for producing a sealed optical semiconductor device as claimed in claim 9, wherein the temperature $T_2$ is not less than 70° C. and not more than 180° C.

12. The method for producing a sealed optical semiconductor device as claimed in claim 9, wherein a plurality of optical semiconductor elements are mounted on the optical semiconductor element mounting substrate, and a minimum distance between the optical semiconductor elements on the optical semiconductor element mounting substrate is greater than the total thickness of the sealing films.

13. The method for producing a sealed optical semiconductor device as claimed in claim 1, wherein each of the inner layer sealing film and the outermost sealing film has a thickness of not less than 10 μm and not more than 300 μm.

14. The method for producing a sealed optical semiconductor device as claimed in claim 13, wherein the temperature $T_2$ is not less than 70° C. and not more than 180° C.

15. The method for producing a sealed optical semiconductor device as claimed in claim 1, wherein the temperature $T_2$ is not less than 70° C. and not more than 180° C.

16. The method for producing a sealed optical semiconductor device as claimed in claim 1, wherein a plurality of optical semiconductor elements are mounted on the optical semiconductor element mounting substrate, and a minimum distance between the optical semiconductor elements on the optical semiconductor element mounting substrate is greater than the total thickness of the sealing films.

17. The method for producing a sealed optical semiconductor device as claimed in claim 16, wherein a plurality of optical semiconductor elements are mounted on the optical semiconductor element mounting substrate, and the aspect ratio (T/L) between the height T of the optical semiconductor element and the distance L between the optical semiconductor elements on the optical semiconductor element mounting substrate is, at maximum, not more than 3.

18. The method for producing a sealed optical semiconductor device as claimed in claim 1, wherein a plurality of optical semiconductor elements are mounted on the optical semiconductor element mounting substrate, and the aspect ratio (T/L) between the height T of the optical semiconductor element and the distance L between the optical semiconductor elements on the optical semiconductor element mounting substrate is, at maximum, not more than 3.

* * * * *